United States Patent
Giordano et al.

(10) Patent No.: US 9,810,742 B2
(45) Date of Patent: Nov. 7, 2017

(54) SYSTEM AND METHOD FOR MONITORING RELAY CONTACTS

(71) Applicant: Lear Corporation, Southfield, MI (US)

(72) Inventors: Federico Giordano, Valls (ES); Antoni Ferre Fabregas, Valls (ES)

(73) Assignee: Lear Corporation, Southfield, MI (US)

( * ) Notice: Subject to any disclaimer, the term of this patent is extended or adjusted under 35 U.S.C. 154(b) by 150 days.

(21) Appl. No.: 14/520,473

(22) Filed: Oct. 22, 2014

(65) Prior Publication Data

US 2015/0137819 A1    May 21, 2015

Related U.S. Application Data

(60) Provisional application No. 61/898,058, filed on Oct. 31, 2013.

(51) Int. Cl.
| | |
|---|---|
| *G01R 31/327* | (2006.01) |
| *G01R 31/00* | (2006.01) |
| *H01H 1/00* | (2006.01) |
| *G01R 31/333* | (2006.01) |

(52) U.S. Cl.
CPC ....... *G01R 31/3278* (2013.01); *G01R 31/006* (2013.01); *G01R 31/327* (2013.01); *H01H 1/0015* (2013.01); *G01R 31/333* (2013.01)

(58) Field of Classification Search
CPC .............. G01R 31/006; G01R 31/327; G01R 31/3278; G01R 31/333; G01R 31/00; H01H 1/0015
USPC ................................................. 324/415, 418
See application file for complete search history.

(56) References Cited

U.S. PATENT DOCUMENTS

| | | | | |
|---|---|---|---|---|
| 4,280,164 A | * | 7/1981 | Kozek ..................... | F16P 3/144 192/129 R |
| 5,172,291 A | * | 12/1992 | Bakely ..................... | H01H 9/56 361/5 |
| 5,277,244 A | | 1/1994 | Mehta | |
| 5,748,427 A | | 5/1998 | Yerkovich et al. | |
| 6,441,573 B1 | * | 8/2002 | Zuber ...................... | B60L 7/26 318/273 |
| 6,989,978 B2 | | 1/2006 | Hiraku et al. | |

(Continued)

FOREIGN PATENT DOCUMENTS

| | | |
|---|---|---|
| DE | 10 2006 047 469 A1 | 4/2008 |
| DE | 10 2011 003 279 A1 | 8/2011 |

OTHER PUBLICATIONS

Office Action issued by the German Patent Office for German Application No. 10 2014 016 218.4, dated Mar. 10, 2017, 7 pages.

*Primary Examiner* — Hoai-An D Nguyen
(74) *Attorney, Agent, or Firm* — Brooks Kushman P.C.

(57) ABSTRACT

A system and method are disclosed for monitoring at least one relay contact. The system may include an emitter adapted for communication with a relay contact and configured to emit a signal, and a receiver adapted for communication with the relay contact and configured to detect a signal emitted by the emitter. The system may further include a controller adapted for communication with the emitter and receiver, and configured to determine an open or closed state of the relay contact. The controller may control the emitter to emit a signal, may determine a closed state of the relay contact if the receiver detects the signal, and may determine an open state of the relay contact if the receiver fails to detect the signal.

16 Claims, 5 Drawing Sheets

(56) References Cited

U.S. PATENT DOCUMENTS

| | | | |
|---|---|---|---|
| 7,557,583 B2 | 7/2009 | Zettel et al. | |
| 8,339,139 B2 | 12/2012 | Barrenscheen et al. | |
| 2011/0316544 A1* | 12/2011 | Kirsch | G01R 31/3278 324/418 |
| 2012/0112728 A1* | 5/2012 | Bodo | G01R 15/142 323/311 |
| 2015/0055269 A1* | 2/2015 | Kim | H01H 47/22 361/170 |
| 2015/0115966 A1* | 4/2015 | Berman | B60L 3/0023 324/418 |
| 2015/0194276 A1* | 7/2015 | Johansson | H01H 1/0015 324/415 |
| 2015/0198666 A1* | 7/2015 | Edwards | H03K 17/18 324/415 |

* cited by examiner

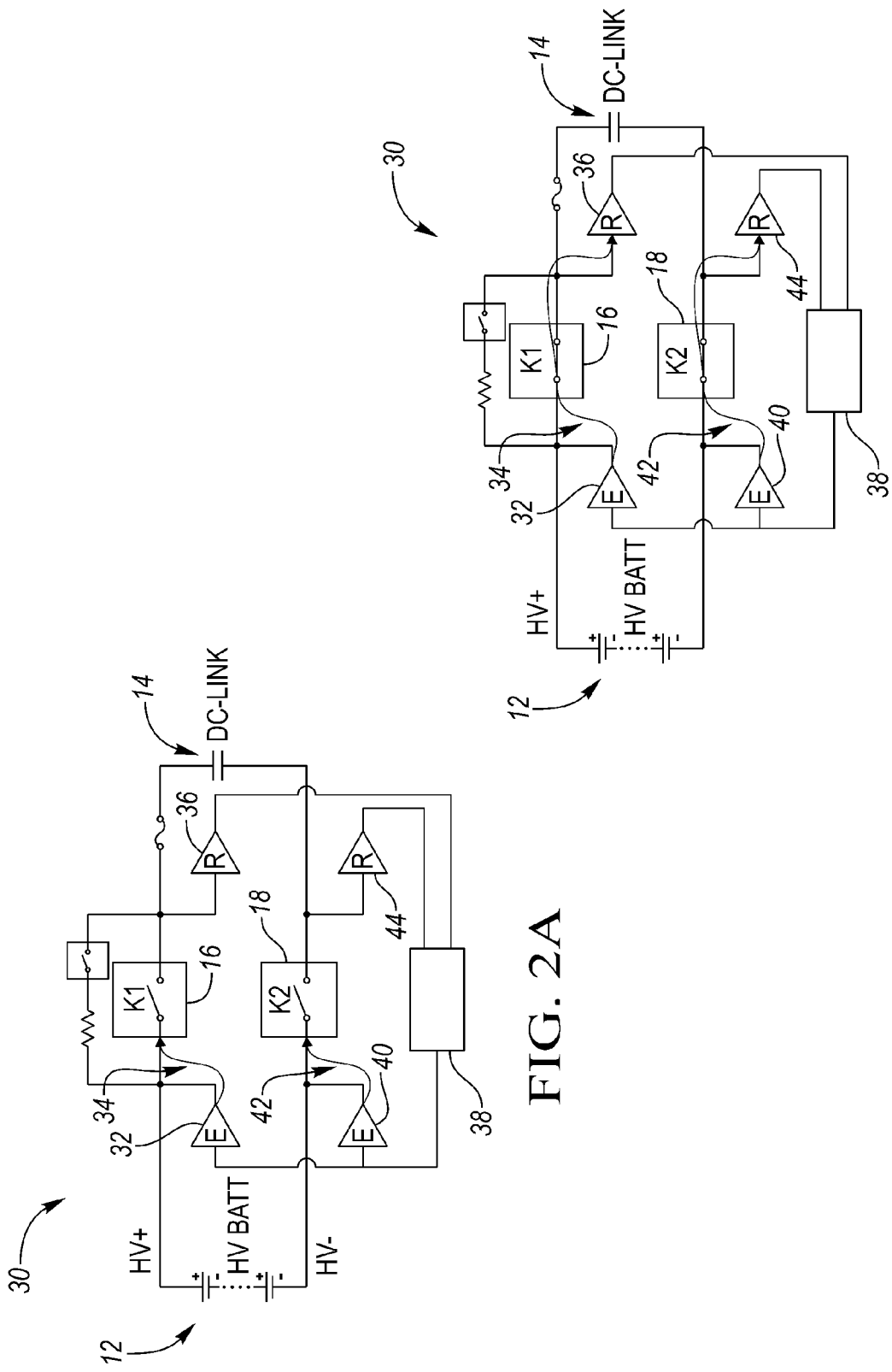

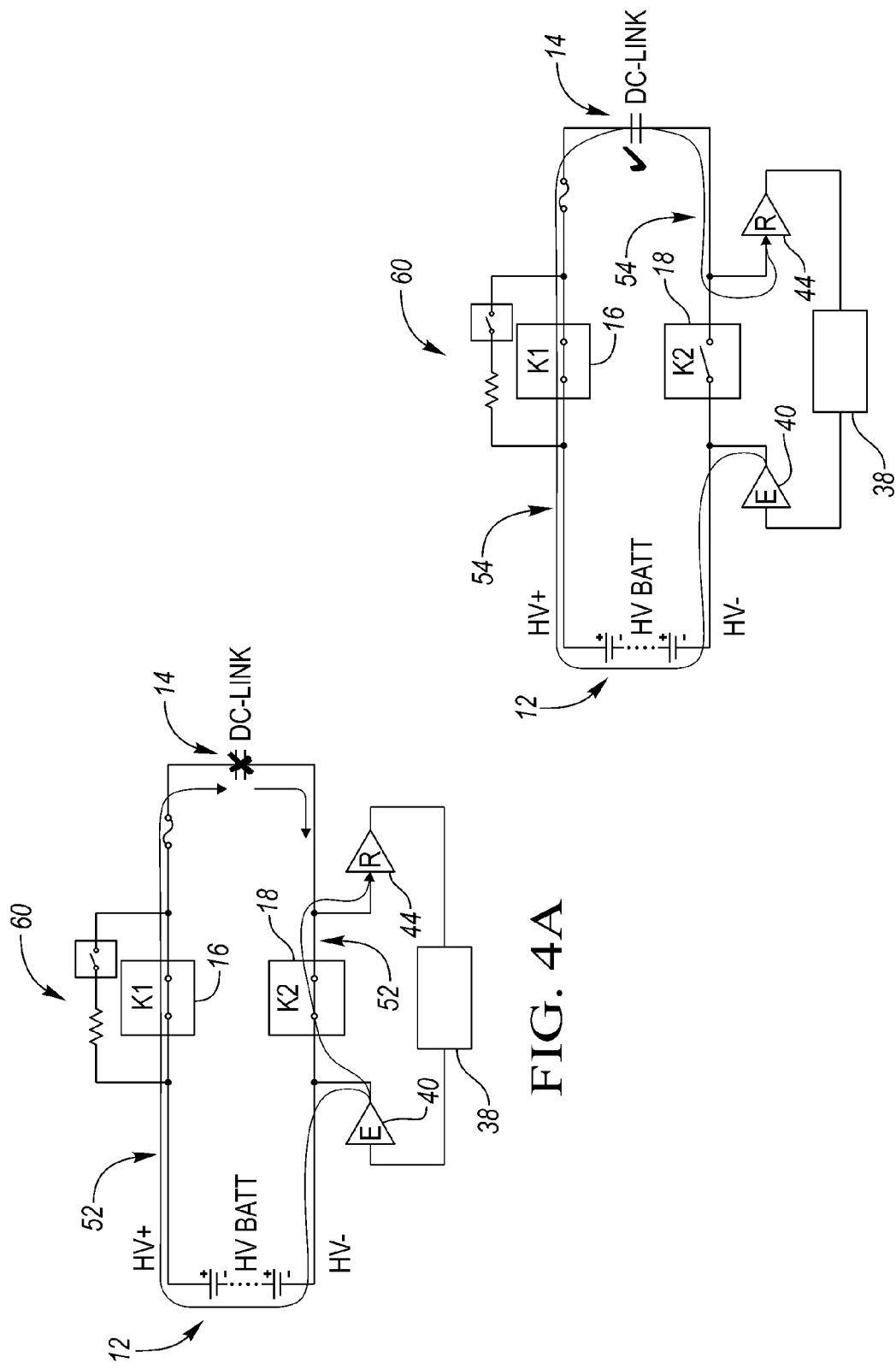

SYSTEM AND METHOD FOR MONITORING RELAY CONTACTS

CROSS-REFERENCE TO RELATED APPLICATIONS

This application claims the benefit of U.S. provisional application Ser. No. 61/898,058 filed Oct. 31, 2013, the disclosure of which is incorporated in its entirety by reference herein.

TECHNICAL FIELD

This present disclosure relates to a system and method for monitoring a relay contact, such as in a junction box for use in an electric vehicle (EV), plug-in hybrid electric vehicle (PHEV), or hybrid electric vehicle (HEV).

BACKGROUND

An electric vehicle (EV), plug-in hybrid electric vehicle (PHEV), or hybrid electric vehicle (HEV) may be provided with a power circuit that may include multiple high voltage power relays. The high voltage power relays, which may be arranged in an EV/PHEV/HEV junction box, may be operable to conduct electrical power from a vehicle power source to a vehicle system or subsystem. A controller may be in communication with the power circuit to command the relays open or closed.

A system and method is usually required to effectively monitor relay contact state (i.e., determine whether a relay contact is open or closed) and provide a reliable diagnosis for welded relay contacts in junction boxes of electric vehicles. More generally, such a system and method may be required to diagnose electrical continuity or electrical interruption of any conducting path, such as in relay contacts, fuses or busbars.

Usually, voltage measurements at both sides of a relay contact are used for diagnosis of the state of the main contactors of the relay. This strategy, involving a direct current (DC) measurement with duplication of sensing channels, fails to detect the case where no current is flowing through the contact since no voltage drop is developed. This strategy also forces the sensing channel and electronics to withstand high DC common mode negative voltages when contacts are open. Therefore, a need exists for a system and method to effectively detect relay contact state independently of current flowing through said contacts and that does not suffer from negative common mode voltages.

SUMMARY

According to an embodiment described herein, a system is provided for monitoring at least one relay contact. The system may comprise an emitter adapted for communication with a first side of a first relay contact, and the emitter may be configured to emit a signal. The system may also comprise a first receiver adapted for communication with a second side of the first relay contact and configured to detect a signal emitted by the emitter. The system may further comprise a controller adapted for communication with the emitter and the first receiver, the controller configured to determine an open or a closed state of the first relay contact. The controller may control the emitter to emit a signal, and may determine a closed state of the first relay contact if the first receiver detects the signal. The controller may determine an open state of the first relay contact if the first receiver fails to detect the signal.

According to another embodiment described herein, a system is provided for monitoring a first relay contact and a second relay contact, each of the first and second relay contacts having a first side and a second side. The system may comprise an emitter adapted for communication with each first side of the first and second relay contacts, and the emitter may be configured to emit a signal. The system may also comprise a receiver adapted for communication with each second side of the first and second relay contacts and configured to detect a signal emitted by the emitter. The system may further comprise a controller adapted for communication with the emitter and the receiver, the controller configured to determine an open or a closed state of each of the first and second relay contacts. The controller may control the emitter to emit a signal having a first component and a second component different than the first component. The controller may determine a closed state of the first relay contact and an open state of the second relay contact if the receiver detects only the second component of the signal. The controller may determine a closed state of the second relay contact if the receiver detects the first component of the signal. The controller may determine an open state of both the first relay contact and the second relay contact if the receiver fails to detect both the first and second components of the signal.

According to another embodiment described herein, a method is provided for monitoring at least one relay contact. The method may comprise emitting a signal, determining a closed state of the first relay contact if a first receiver detects the signal, and determining an open state of the first relay contact if the first receiver fails to detect the signal.

According to another embodiment described herein, a method is provided for monitoring a first relay contact and a second relay contact. The method may comprise emitting a signal which may comprise a first component and a second component different than the first component. The method may further comprise determining a closed state of the first relay contact and an open state of the second relay contact if a receiver detects only the second component of the signal. The method may further comprise determining a closed state of the second relay contact if the receiver detects the first component of the signal and determining an open state of both the first relay contact and the second relay contact if the receiver fails to detect both the first and second components of the signal.

BRIEF DESCRIPTION OF THE DRAWINGS

FIGS. 2A and 2B are simplified schematic diagrams of an exemplary embodiment of a system and method for monitoring relay contacts;

FIGS. 4A and 4B are simplified schematic diagrams of another exemplary embodiment of a system and method for monitoring relay contacts.

DETAILED DESCRIPTION

As required, detailed embodiments of the present disclosure are provided herein. However, it is to be understood that the embodiments provided are merely exemplary of the disclosure that may be embodied in various and alternative forms. The figures are not necessarily to scale. Some features may be exaggerated or minimized to show details of particular components. Therefore, specific structural and functional details disclosed herein are not to be interpreted as limiting, but merely as a representative basis for teaching one skilled in the art.

As previously described, an electric vehicle (EV), plug-in hybrid electric vehicle (PHEV), or hybrid electric vehicle (HEV) may be provided with a power circuit that may include multiple high voltage power relays. The high voltage power relays, which may be arranged in an EV/PHEV/HEV junction box, may be operable to conduct electrical power from a vehicle power source to a vehicle system or subsystem. A controller may be in communication with the power circuit to command the relays open or closed.

Figure 1:
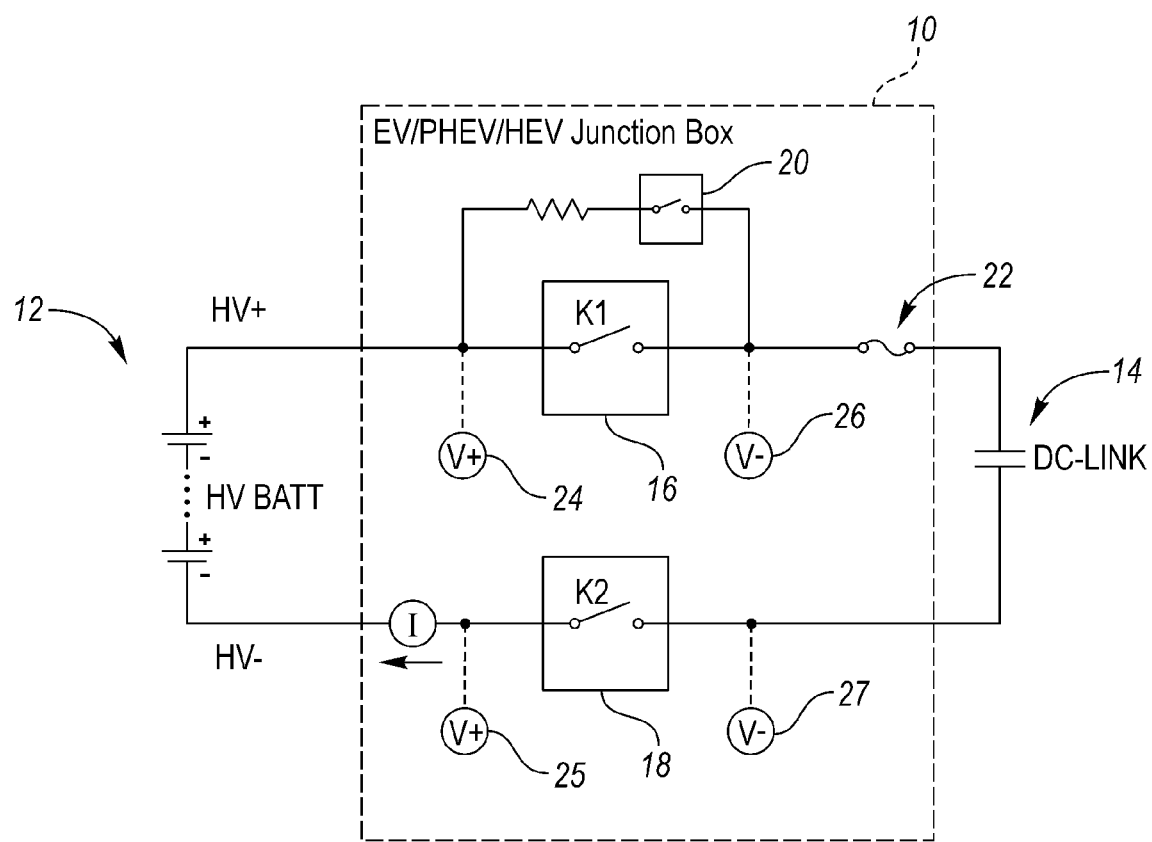
FIG. 1 is a simplified schematic diagram of an exemplary EV/PHEV/HEV junction box.

FIG. 1 depicts a typical, simplified schematic of an EV/PHEV/HEV junction box 10. Junction box 10 may be provided in communication with a High-Voltage battery 12 and a DC-link 14. Junction box 10 may comprise main relays 16, 18 having main contactors $K_1$, $K_2$, as well as a pre-charge relay 20, a fuse 22, and voltage and current measuring nodes 24, 25, 26, 27. As previously noted, a system and method is usually required to effectively monitor relay contact state (i.e., determine whether a relay contact 16, 18 is open or closed) and provide a reliable diagnosis for welded relay contacts, such as in EV/PHEV/HEV junction boxes. Usually, voltage measurements at both sides of a relay contact 16, 18 are used for diagnosis of the state of the main contactors $K_1$, $K_2$.

This strategy, involving a DC measurement with duplication of sensing channels, fails to detect the case where no current is flowing through the contacts 16, 18 since no voltage drop is developed. This strategy also forces the sensing channel and electronics to withstand high DC common mode negative voltages when contacts 16, 18 are open.

Therefore, a need exists for a system and method to effectively detect relay contact state independently of current flowing through said contacts and that does not suffer from negative common mode voltages. This may be accomplished using a signal emitter and a signal receiver to achieve relay contact welding diagnosis, such as one at each side of a contact to be diagnosed.

Referring now to FIGS. 2A and 2B, simplified schematic diagrams are shown of an exemplary embodiment of a system and method for monitoring relay contacts. Welding occurs when a relay coil (not shown) associated with a relay 16, 18 is driven in order to open the contactor $K_1$, $K_2$ but, due to some damage in the relay 16, 18, the contactor $K_1$, $K_2$ is stuck or welded and therefore maintains a conductive path.

As seen in FIGS. 2A and 2B, a system 30 may be provided for monitoring a first relay contact 16. The system 30 may comprise an emitter 32 adapted for communication with a first side of the relay contact 16 and configured to emit a signal 34. The signal 34 may be emitted by the emitter 32 around a rail voltage of the contact 16. That is, the signal 34 may be a voltage signal superimposed on the rail voltage of the contact 16. In that regard, exemplary values for rail voltages may be 450V for an electric vehicle, 200V for a hybrid vehicle, 48V for a micro-hybrid vehicle, 24V for trucks, and 12V for conventional combustion engine vehicles. It should thus be noted that, while EV/PHEV/HEV environments are shown and described herein, the embodiments described in the present disclosure may be used for monitory relay contacts employed in other vehicle types or non-vehicle environments.

The system may also comprise a first receiver 36 adapted for communication with a second side of the relay contact 16 and configured to detect the signal 34 emitted by the emitter 32. The system may further comprise a controller or control unit 38 adapted for communication with the emitter 32 and the first receiver 36. The controller 38 may be configured to determine an open or a closed state of the first relay contact 16. In that regard, the controller 38 may control the emitter 32 to emit a signal 34, such as after a relay coil is driven in order to open the first relay contact 16 or prior to closing the first relay contact 16. The controller 38 may determine a closed state of the first relay contact 16 if the first receiver 36 detects the signal 34, and the controller 38 may determine an open state of the first relay contact 16 if the first receiver 36 fails to detect the signal 34.

Still referring to FIGS. 2A and 2B, when more than one relay contact, such as first and second relay contacts 16, 18, are to be diagnosed, first and second emitters 32, 40 and first and second receivers 36, 44 may be placed on each side of the first and second contacts 16, 18. As seen therein, the first and second emitters 32, 40 may generate first and second signals or perturbations 34, 42, such as around the rail voltage of the first and second relays 16, 18 where the contacts $K_1$, $K_2$ are to be diagnosed. In that regard, the first emitter 32 may be configured to emit a first signal 34 that is different than a second signal 42 that may be emitted by the second emitter 40. As well, the first receiver 36 may be configured to detect the first signal 34 emitted by first emitter 32, and the second receiver 44 may be configured to detect second signal 42 emitted by second emitter 40. As seen in FIG. 2B, the first and second receivers 36, 44 detect the first and second signals or perturbations 34, 42 when the contacts $K_1$, $K_2$ are closed. As seen in FIG. 2A, the first and second receivers 36, 44 do not detect the first and second signals or perturbations 34, 42 when the contacts $K_1$, $K_2$ are open.

Figures 3A, 3B:
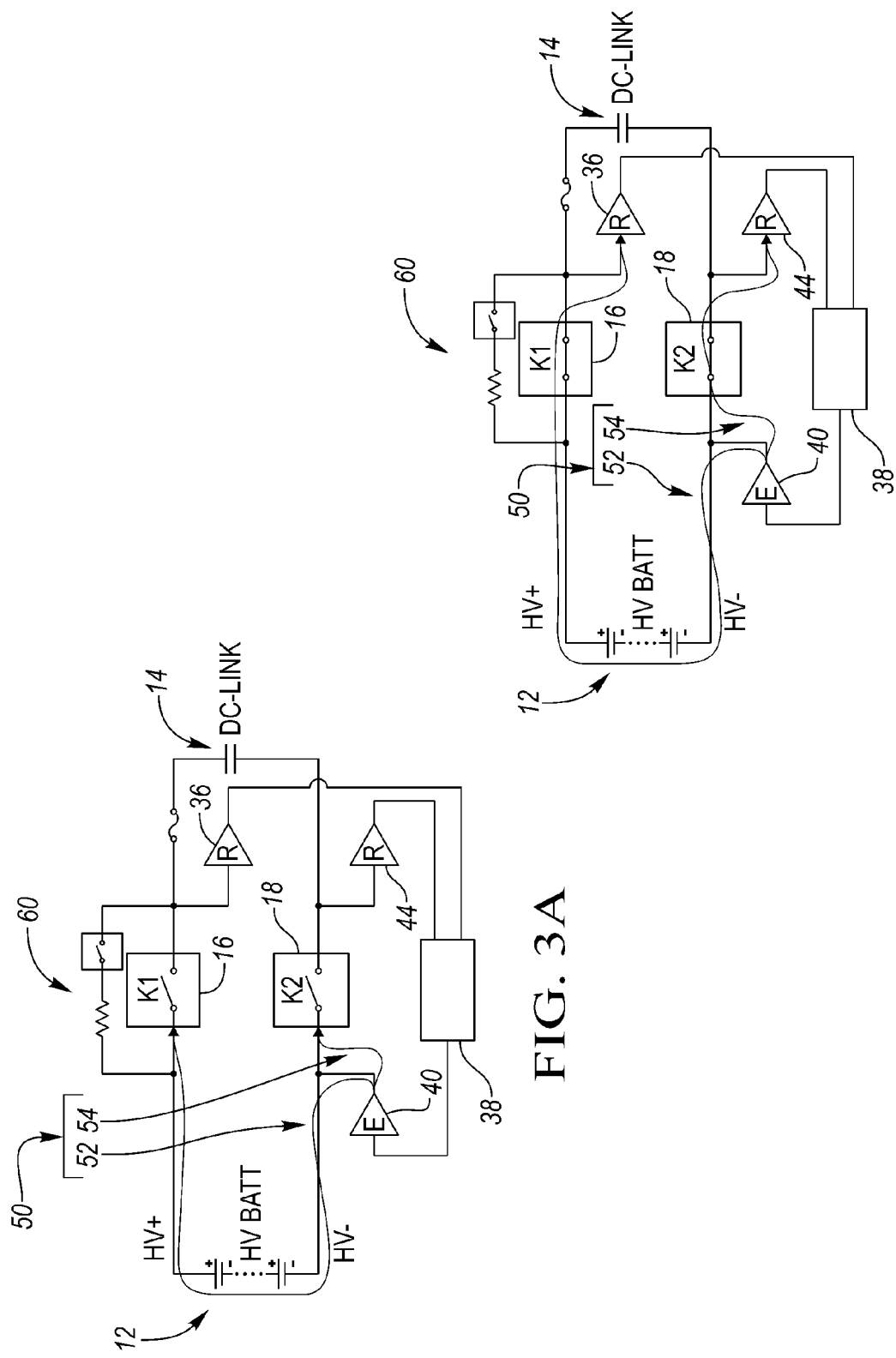
FIGS. 3A and 3B are simplified schematic diagrams of another exemplary embodiment of a system and method for monitoring relay contacts.

Referring now to FIGS. 3A and 3B, simplified schematic diagrams are shown of another exemplary embodiment of a system and method for monitoring relay contacts. As seen therein, in this embodiment, a single emitter 40 may be provided along with receivers 36, 44, where each receiver 36, 44 may be associated with a relay contact 16, 18. The single emitter 40 may be configured to produce a signal 50 comprising two components. Each of these components may be provided with different characteristics such as a different frequency, shape (e.g., pulse-width or waveform), amplitude, embedded digital identifier and/or other characteristic(s). These components, depending on the state of the circuit, may be uniquely detected by each receiver 36, 44 in order to monitor the state of relay contacts 16, 18.

As seen in FIGS. 3A and 3B, a system 60 may comprise a single emitter 40 adapted for communication with a first side of a first relay contact 16 and with a first side of a second relay contact 18. The system 60 may further comprise a first receiver 36 adapted for communication with a second side of the first relay contact 16 and configured to detect the signal 50 emitted by the emitter 40, and a second receiver 44 adapted for communication with a second side of the second relay contact 18 and configured to detect the signal 50 emitted by the emitter 40. The signal 50 may comprise a first component 52 and a second component 54 different than the first component.

The system 60 may further comprise a controller or control unit 38 adapted for communication with the first and second receivers 36, 44 and configured to determine an open or a closed state of the first and second relay contacts 16, 18. The controller 38 may control the emitter 40 to emit the signal 50, such as after relay coils are driven in order to open the first and second relay contacts 16, 18 or prior to closing the first and second relays 16, 18. The controller 38 may determine a closed state of the first relay contact 16 if the first receiver 36 detects the signal 50 (FIG. 3B), and the controller 38 may determine an open state of the first relay contact 16 if the first receiver 36 fails to detect the signal 50 (FIG. 3A). The controller 38 may determine a closed state of the second relay contact 18 if the second receiver 44 detects the signal 50 (FIG. 3B), and the controller 38 may determine an open state of the second relay contact 18 if the second receiver 44 fails to detect the signal 50 (FIG. 3A).

As previously described, the first component 52 of the signal 50 may have a first frequency, the second component 54 may have a second frequency different than the first frequency. Alternatively, the first component 52 may have a first shape, and the second component 54 may have a second shape different than the first shape. The first component 52 alternatively may have a first amplitude, and the second component 54 may have a second amplitude different than the first amplitude. The first component 52 may alternatively have a first digital identifier, which may be embedded in the signal 50, and the second component 54 may have a second digital identifier, which may be embedded in the signal 50, different than the first digital identifier. Still further, the signal 50 may comprise first and second signals 52, 54, the first signal having the first component and the second signal having the second component. In each case, the first receiver 36 may be configured to uniquely detect the first component or signal 52, and the second receiver 44 may be configured to uniquely detect the second component or signal 54.

Referring now to FIGS. 4A and 4B, simplified schematic diagrams are shown of another exemplary embodiment of a system and method for monitoring relay contacts. As seen therein, in this embodiment, a single emitter 40 and a single receiver 44 are used for detecting welding of relay contacts 16, 18. Detecting of a welded contact 16, 18 is possible using a signal 50 formed by two signal components 52, 54, each with different characteristics, such as frequency or other characteristic(s) as previously described.

For example, the emitter 40 may generate a signal 50, S(f), which may be defined as in equation (1) below:

$$S(f)=L(f)+H(f) \quad (1)$$

where L(f) is a low frequency signal component 52 that cannot pass through battery 12 and DC-link 14 impedance (or it is significantly attenuated), and H(f) is a higher frequency signal component 54 that can pass though battery 12 and DC-link 14 impedance (or passes with small attenuation).

The signal, R(f), detected by the receiver 44 may be defined as in equation (2) below:

$$R(f)=K_2*L(f)+K_2*H(f)+K_1*H(f) \quad (2)$$

where $K_i=0$ if the relay 16, 18 is open and $K_i=1$ if the relay 16, 18 is in a closed state, for i=1, 2.

In this way, welding of $K_1$ and $K_2$ contactors may be detectable as follows. First, the two contactors $K_1$ and $K_2$ may be set in "open" state. This may be accomplished by controller 38 or another device (not shown) in communication with relay coils (not shown) controlling relays 16, 18. In particular:

if the relays 16, 18 are in a "closed" state, they may be commanded to go to an "open" state; or if the relays 16, 18 are already in an "open" state, they may be maintained in an "open" state.

Then, the described signal 50, S(f), may be generated. If the low frequency signal component 52, L(f), is detected by the receiver 44, the controller 38 determines that $K_2$ is welded (FIG. 4A). If the relay $K_2$ is not welded, the signal 50 cannot be transmitted through relay $K_2$ (neither the low frequency component 52 nor the high frequency component 54). Therefore, if the high frequency signal component 54, H(f), is detected in the receiver 44, the controller 38 determines that $K_1$ is welded (FIG. 4B). If signal 50 is not received by receiver 44, the controller 38 determines that neither of the relay contactors $K_1$, $K_2$ is welded.

It should be noted that, broadly speaking, the lower frequency component 52, L(f), and the higher frequency component 54, H(f), described above range from the frequency needed to pass through the impedance of the battery 12 but not the impendence of the DC Link 14 (or vice versa), and the frequency needed to pass through both impedances. More quantitatively, such frequencies may range from 0 Hz to several Khz, but will depend on the particular frequency response of such elements (e.g., battery 12 and DC-Link 14) and "tuning" of those frequencies to each particular manifestation of such elements may be required.

Still referring to FIGS. 4A and 4B, in this embodiment, a system 60 is provided for monitoring a first relay contact 16 and a second relay contact 18, each of the first and second relay contacts 16, 18 having a first side and a second side. The system 60 may comprise an emitter 40 adapted for communication with each first side of the first and second relay contacts 16, 18 and configured to emit a signal 50, such as around a rail voltage of the contacts 16, 18. The system 60 may further comprise a receiver 44 adapted for communication with each second side of the first and second relay contacts 16, 18 and configured to detect a signal 50 emitted by the emitter 40.

The system 60 may further comprise a controller or control unit 38 adapted for communication with the emitter 40 and the receiver 44. The controller 38 may be configured to determine an open or a closed state of each of the first and second relay contacts 16, 18. The controller 38 may control the emitter 40 to emit a signal 50 having a first component 52 and a second component 54 different than the first component 52, such as after relay coils are driven in order to open the first and second relay contacts 16, 18 or prior to closing the first and second relay contacts 16, 18. The controller 38 may determine a closed state of the first relay contact 16 and an open state of the second relay contact 18 if the receiver 44 detects only the second component 54 of the signal 50. The controller 38 may determine a closed state of the second relay contact 18 if the receiver 44 detects the first component 52 of the signal 50. The controller 38 may determine an open state of both the first relay contact 16 and the second relay contact 18 if the receiver 44 fails to detect both the first and second components 52, 54 of the signal 50.

In that regard, the first component 52 of the signal 50 may have a frequency that is substantially attenuated by a battery 12 and/or a DC-link 14 impedance, and the second component 54 of the signal 50 may have a frequency that is non-substantially attenuated by a battery 12 and a DC-link 14 impedance. More particularly, the first component 52 may be lower frequency signal, L(f), that is substantially attenuated by a battery 12 and/or a DC-link 14 impedance, and the second component 54 may be higher frequency signal, H(f), that is non-substantially attenuated by a battery 12 and a DC-link 14 impedance. The frequency of the signal 50, S(f), emitted by the emitter 40 may be defined by the equation $S(f)=L(f)+H(f)$. A signal, $R(f)$, detected by a receiver 44 may be defined by the equation $R(f)=K_2*L(f)+K_2*H(f)+K_1*H(f)$, where $K_i=0$ if a relay 16, 18 has an open state and $K_i=1$ if a relay 16, 18 has a closed state, for i=1, 2.

As variously described herein, a controller or control unit 38 may be provided in communication with emitter(s) 32, 40 and/or receiver(s) 36, 44 for controlling emitter(s) 32, 40 to send or generate signals 34, 42, 50, for receiving information from the receiver(s) 36, 44 regarding the receipt/detection or lack of receipt/detection of those signals 34, 42, 50, and/or for determining the condition or state (open/closed) of one or more relay contacts 16, 18. Such a controller or control unit 38 may comprise or include an application specific integrated circuit (ASIC) and/or a microcontroller, microprocessor, programmable digital signal processor, programmable logic device, or any other type of programmable device(s). Where the controller or control unit 38 includes a programmable device, such as a microprocessor, the controller or control unit 38 may further include computer executable instructions stored in a memory for performing one or more of the various procedures, operations and/or functions of the system and method, as described herein Referring now to FIG. 5, a simplified flowchart of an exemplary embodiment of a method for monitoring relay contacts is shown. More particularly, FIG. 5 illustrates the detection procedure in an environment with a single emitter and a single receiver for diagnosing two welded contacts, such as the exemplary environment depicted in FIGS. 4A and 4B.

Figure 5:
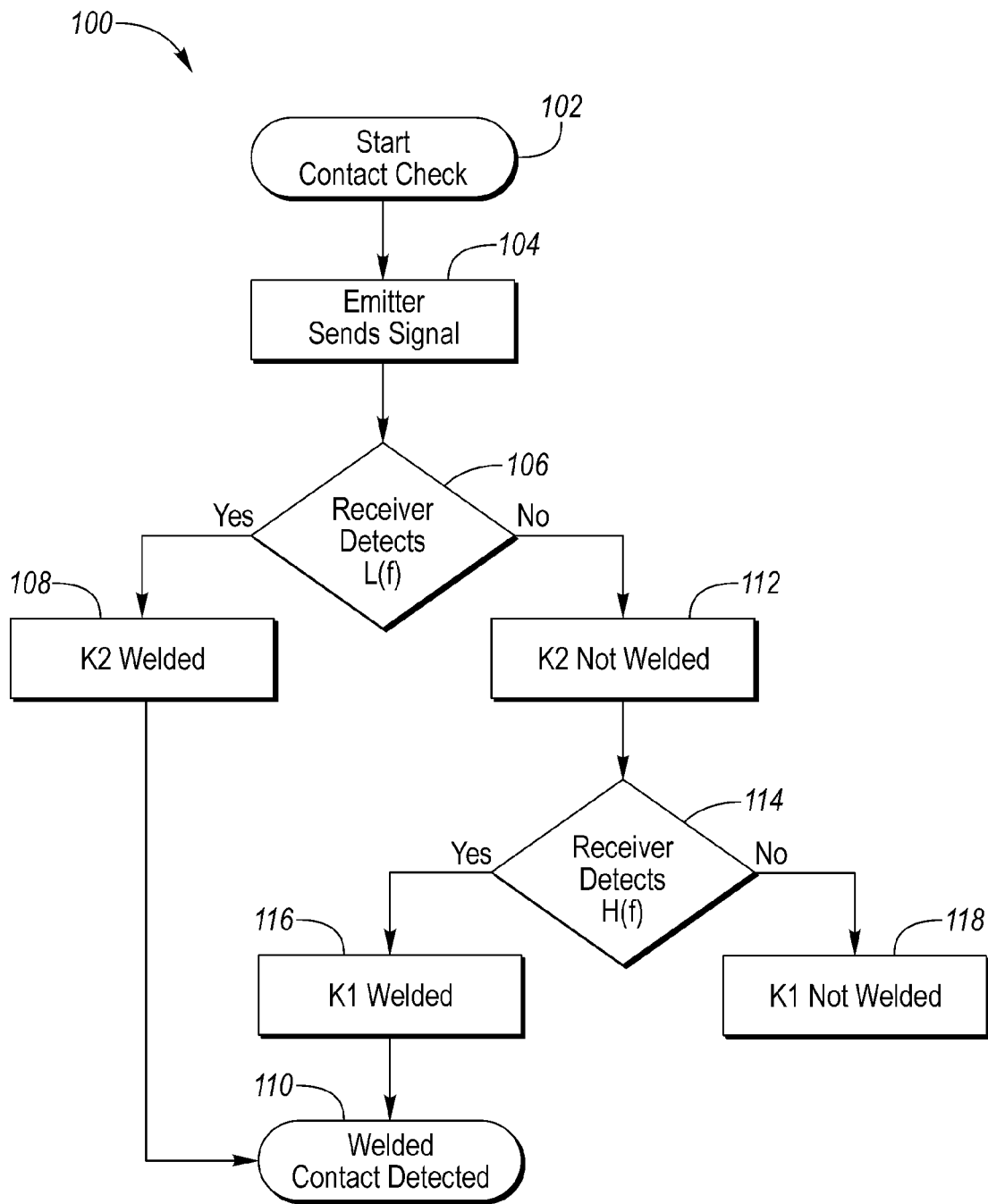
FIG. 5 is simplified flowchart of an exemplary embodiment of a method for monitoring relay contacts.

As will be appreciated by one of ordinary skill in the art, the flowchart of FIG. 5 may represent control logic which may be implemented or affected in hardware, software, or a combination of hardware and software. The various functions may be affected by a programmable device, an application specific integrated circuit (ASIC), a microcontroller, microprocessor, programmable digital signal processor, computer executable instructions stored in a memory, programmable logic device, or any other type of programmable device(s), such as the controller or control unit 38 (see FIGS. 2A, 2B, 3A, 3B, 4A, 4B) previously described.

Such control logic may be implemented using any of a number of known programming and processing techniques or strategies and is not limited to the order or sequence illustrated. For instance, interrupt or event-driven processing may be employed in real-time control applications rather than a purely sequential strategy as illustrated Likewise, parallel processing, multitasking, or multi-threaded systems and methods may be used. Such control logic may also be independent of the particular programming language, operating system, processor, or circuitry used to develop and/or implement the control logic illustrated. Likewise, depending upon the particular programming language and processing strategy, various functions may be performed in the sequence illustrated, at substantially the same time, or in a different sequence while accomplishing the method of control. The illustrated functions may be modified, or in some cases omitted, without departing from the scope intended.

Still referring to FIG. 5, and with continuing reference to FIGS. 4A and 4B, the method 100 may begin at block 102 with a start relay contact check. At block 104, the emitter 40 may send or emit a signal 50 having a first component 52 (e.g., $L(f)$) and a second component 54 (e.g., $H(f)$). As previously described in connection with FIGS. 4A and 4B, the emitter 40 may emit the signal 50 around the rail voltage of relay contacts 16, 18. The emitter 40 may also emit the signal 50 after relay coils are driven in order to open the relay contacts 16, 18 or prior to closing the relay contacts 16, 18.

At block 106, the controller 38 determines whether the receiver 44 has detected the first component 52 of the signal 50 emitted by emitter 40. If so, the controller 38 determines at block 108 that contactor $K_2$ of the second relay 18 is welded. In that event, the method 100 then ends at block 110 with the detection of a welded relay contact.

Alternatively, if the controller 38 determines at block 106 that the receiver 44 has not detected the first component 52 of the signal 50 emitted by emitter 40, then the controller 38 determines at block 112 that contactor $K_2$ is not welded. In that event, the controller 38 determines at block 114 whether the receiver 44 has detected the second component 54 of the signal 50 emitted by emitter 40. If so, the controller 38 determines at block 116 that contactor $K_1$ of the first relay 16 is welded. In that event, the method 100 again ends at block 110 with the detection of a welded relay contact.

Alternatively, if the controller 38 determines at block 114 that the receiver 44 has not detected the second component 54 of the signal 50 emitted by emitter 40, then the controller 38 determines at block 118 that contactor $K_1$ of the first relay 16 is not welded. In that event, it has then been determined that neither of the contactors $K_1$, $K_2$ of the relays 16, 18 are welded.

In such a fashion, a method 100 may be provided for monitoring a first relay contact and a second relay contact. The method may comprise emitting a signal, which may be a signal around a rail voltage of the relay contacts emitted after relay coils are driven in order to open the first and second relay contacts or prior to closing the first and second relay contacts, the signal having a first component and a second component different than the first component. The method may further comprise determining a closed state of the first relay contact and an open state of the second relay contact if a receiver detects the second component of the signal, determining a closed state of the second relay contact if the receiver detects the first component of the signal, and determining an open state of both the first relay contact and the second relay contact if the receiver fails to detect both the first and second components of the signal.

In that regard, as previously described, the first component of the signal may be a lower frequency signal, $L(f)$, that is substantially attenuated by a battery and/or a DC-link impedance, and the second component may be a higher frequency signal, $H(f)$, that is non-substantially attenuated by a battery and a DC-link impedance. The frequency of the emitted signal, $S(f)$, may be defined by the equation $S(f)=L(f)+H(f)$. A signal, $R(f)$, detected by the receiver may defined by the equation $R(f)=K_2*L(f)+K_2*H(f)+K_1* H(f)$, where $K_i=0$ if a relay has an open state and $K_i=1$ if a relay has a closed state, for i=1, 2.

According to another embodiment, a method 100 may be provided for monitoring at least one relay contact. The method may comprise emitting a signal, which may be a signal emitted around a rail voltage of a first relay contact after a relay coil is driven in order to open the first relay contact or prior to closing the first relay contact. The method may further comprise determining a closed state of the first relay contact if a first receiver detects the signal, and determining an open state of the first relay contact if the first receiver fails to detect the signal.

In that regard, the signal emitted may comprise a first component and a second component different than the first component. The method 100 may further comprise determining a closed state of the second relay contact if a second receiver detects the signal, and determining an open state of the second relay contact if the second receiver fails to detect the signal.

As previously described, the first component of the signal may have a first frequency, the second component may have a second frequency different than the first frequency. Alternatively, the first component may have a first shape, and the second component may have a second shape different than the first shape. The first component alternatively may have a first amplitude, and the second component may have a second amplitude different than the first amplitude. The first component may alternatively have a first digital identifier, which may be embedded in the emitted signal, and the second component may have a second digital identifier, which may be embedded in the emitted signal, different than the first digital identifier. Still further, the emitted signal may comprise first and second signals, the first signal having the first component and the second signal having the second component. In each case, the first component or signal may be uniquely detected by the first receiver, and the second component or signal may be uniquely detected by the second receiver.

While exemplary embodiments are described above, it is not intended that these embodiments describe all possible forms of the present disclosure. Rather, the words used in the specification are words of description rather than limitation, and it is understood that various changes may be made without departing from the spirit and scope of the present disclosure. Additionally, the features of various implementing embodiments may be combined to form further embodiments.

What is claimed is:

1. A system for monitoring at least one relay contact, the system comprising:
   an emitter adapted for electrical communication with a first side of a first relay contact and for electrical communication with a first side of a second relay contact, the emitter configured to emit a monitoring signal;
   a first receiver adapted for electrical communication with a second side of the first relay contact and configured to detect the monitoring signal emitted by the emitter;
   a second receiver adapted for electrical communication with a second side of the second relay contact and configured to detect the monitoring signal emitted by the emitter; and
   a controller adapted for electrical communication with the emitter and the first and second receivers, the controller configured to determine an open or a closed state of the first relay contact and to determine an open or a closed state of the second relay contact;
   wherein the controller controls the emitter to emit the monitoring signal comprising a first component and a second component different than the first component, the controller determines a closed state of the first relay contact if the first receiver detects the first component, the controller determines an open state of the first relay contact if the first receiver fails to detect the first component, the controller determines a closed state of the second relay contact if the second receiver detects the second component, and the controller determines an open state of the second relay contact if the second receiver fails to detect the second component.

2. The system of claim 1 wherein the controller controls the emitter to emit the monitoring signal around a rail voltage of the first relay contact after a relay coil is driven in order to open the first relay contact or prior to closing the first relay contact.

3. The system of claim 1 wherein the first component has a first amplitude, the second component has a second amplitude different than the first amplitude, the first receiver is configured to detect the first component, and the second receiver is configured to detect the second component.

4. The system of claim 1 wherein the first component has a first frequency, the second component has a second frequency different than the first frequency, the first receiver is configured to detect the first component, and the second receiver is configured to detect the second component.

5. The system of claim 1 wherein the first component has a first digital identifier, the second component has a second digital identifier different than the first digital identifier, the first receiver is configured to detect the first component, and the second receiver is configured to detect the second component.

6. A system for monitoring a first relay contact and a second relay contact, each of the first and second relay contacts having a first side and a second side, the system comprising:
   an emitter adapted for electrical communication with the first side of each of the first and second relay contacts and configured to monitoring signal;
   a receiver adapted for electrical communication with the second side of each of the first and second relay contacts and configured to detect the monitoring signal emitted by the emitter; and
   a controller adapted for electrical communication with the emitter and the receiver, the controller configured to determine an open or a closed state of each of the first and second relay contacts;
   wherein the controller controls the emitter to emit the monitoring having a first component and a second component different than the first component, the controller determines a closed state of the first relay contact and an open state of the second relay contact if the receiver detects only the second component of the monitoring signal, the controller determines a closed state of the second relay contact if the receiver detects the first component of the monitoring signal, and the controller determines an open state of both the first relay contact and the second relay contact if the receiver fails to detect both the first and second components of the monitoring signal.

7. The system of claim 6 wherein the first component of the monitoring signal has a frequency that is substantially attenuated by a battery and/or a DC-link impedance, and the second component of the monitoring signal has a frequency that is non-substantially attenuated by a battery and a DC-link impedance.

8. The system of claim 7 wherein the first component is a lower frequency signal, L(f), the second component is a higher frequency signal, H(f), and the frequency of the monitoring signal emitted by the emitter, S(f), is defined by the equation S(f)=L(f)+H(f).

9. The system of claim 8 wherein a signal detected by the receiver, R(f), is defined by the equation $R(f)=K_2*L(f)+K_2*H(f)+K_1*H(f)$, where $K_i=0$ if a relay has an open state and $K_i=1$ if a relay has a closed state, for i=1, 2.

10. A method for monitoring at least one relay contact, the method comprising:
    emitting a monitoring signal comprising a first component and a second component different than the first component;

determining a closed state of a first relay contact if a first receiver detects the first component; and determining an open state of the first relay contact if the first receiver fails to detect the first component;

determining a closed state of a second relay contact if a second receiver detects the second component, and determining an open state of the second relay contact if the second receiver fails to detect the second component.

11. The method of claim 10 wherein the first component has a first frequency, the second component has a second frequency different than the first frequency, the first receiver is configured to detect the first component, and the second receiver is configured to detect the second component.

12. The method of claim 10 wherein the first component has a first amplitude, the second component has a second amplitude different than the first amplitude, the first receiver is configured to detect the first component, and the second receiver is configured to detect the second component.

13. The method of claim 10 wherein the monitoring signal is emitted around a rail voltage of the first relay contact after a relay coil is driven to open the first relay contact or prior to closing the first relay contact.

14. The method of claim 10 wherein the first component has a first digital identifier, the second component has a second digital identifier different than the first digital identifier, the first receiver is configured to detect the first component, and the second receiver is configured to detect the second component.

15. A method for monitoring a first relay contact and a second relay contact, the method comprising:

emitting a monitoring signal having a first component and a second component different than the first component;

determining a closed state of the first relay contact and an open state of the second relay contact if a receiver detects only the second component of the monitoring signal;

determining a closed state of the second relay contact if the receiver detects the first component of the monitoring signal; and determining an open state of both the first relay contact and the second relay contact if the receiver fails to detect both the first and second components of the monitoring signal.

16. The method of claim 15 wherein the first component is a lower frequency signal, $L(f)$, that is substantially attenuated by a battery and/or a DC-link impedance, the second component is a higher frequency signal, $H(f)$, that is non-substantially attenuated by a battery and a DC-link impedance, and the frequency of the emitted monitoring signal, $S(f)$, is defined by the equation $S(f)=L(f)+H(f)$, and a signal detected by the receiver, $R(f)$, is defined by the equation $R(f)=K_2*L(f)+K_2*H(f)+K_1*H(f)$, where $K_i=0$ if a relay has an open state and $K_i=1$ if a relay has a closed state, for $i=1, 2$.

* * * * *

UNITED STATES PATENT AND TRADEMARK OFFICE
CERTIFICATE OF CORRECTION

PATENT NO. : 9,810,742 B2
APPLICATION NO. : 14/520473
DATED : November 7, 2017
INVENTOR(S) : Federico Giordano et al.

Page 1 of 1

It is certified that error appears in the above-identified patent and that said Letters Patent is hereby corrected as shown below:

In the Claims

Column 10, Line 26, Claim 6:
After "to"
Insert -- emit a --.

Column 10, Lines 35-36, Claim 6:
After "to emit the monitoring"
Insert -- signal --.

Signed and Sealed this
Thirteenth Day of February, 2018

Andrei Iancu
*Director of the United States Patent and Trademark Office*